United States Patent

Brennan et al.

[11] Patent Number: 5,830,773
[45] Date of Patent: Nov. 3, 1998

[54] METHOD FOR FORMING SEMICONDUCTOR FIELD REGION DIELECTRICS HAVING GLOBALLY PLANARIZED UPPER SURFACES

[75] Inventors: William S. Brennan; Robert Dawson; Fred N. Hause; Basab Bandyopadhyay; H. Jim Fulford, Jr., all of Austin; Mark W. Michael, Cedar Park, all of Tex.

[73] Assignee: Advanced Micro Devices, Inc., Sunnyvale, Calif.

[21] Appl. No.: 634,757

[22] Filed: Apr. 17, 1996

[51] Int. Cl.$^6$ .................................................. H01L 21/31
[52] U.S. Cl. .......................... 437/67; 437/228; 437/235; 156/628.1
[58] Field of Search ......................... 156/628.1; 437/235, 437/228, 67

[56] References Cited

U.S. PATENT DOCUMENTS

| 4,662,064 | 5/1987 | Hsu et al. ................................. 29/591 |
| 5,413,953 | 5/1995 | Chien et al. . |
| 5,441,094 | 8/1995 | Pasch . |

FOREIGN PATENT DOCUMENTS

| 0 597 603 A2 | 10/1993 | European Pat. Off. . |
| 60-148139 | 8/1985 | Japan ................................. 156/628.1 |
| 1185944 | 7/1989 | Japan ..................................... 437/240 |
| 1189926 | 7/1989 | Japan ................................. 156/628.1 |

OTHER PUBLICATIONS

International Search Report for PCT/US 97/02502, dated Jun. 4, 1997.
Wolf, Stanley, Silicon Processing for the VLSI Era, vol. 1, (1986) pp. 183–185, 321–323.
Wolf, Stanley, Silicon Processing for the VLSI Era, vol. 2 (1990) pp. 200–201. 222–226, 238–239.

Primary Examiner—Charles L. Bowers, Jr.
Assistant Examiner—Matthew Whipple
Attorney, Agent, or Firm—Kevin L. Daffer; Conley, Rose & Tayon

[57] ABSTRACT

An isolation technique is provided for improving the overall planarity of trench isolation regions relative to adjacent silicon mesas. The isolation process results in a spaced plurality of field dielectric having an upper surface substantially coplanar with each other and with adjacent silicon mesa upper surfaces. The isolation process is thereby a planarization process used with the shallow trench technique, wherein etch-enhancing ions are forwarded into the fill dielectric at upper elevational regions of that dielectric. When subjected to a subsequent etchant, the dopants cause the higher elevational regions to be removed at a faster rate than the lower elevational regions. Thus, selective placement of dopants and etch removal pre-conditions the fill dielectric upper surface to a more planar surface globally across the entire wafer. After etch removal predominantly at the higher elevational regions, the remaining fill dielectric upper surface is removed to a level commensurate with the upper surface of silicon mesas thereby producing separate field dielectrics interposed between silicon mesas. The field dielectrics, regardless of their lateral area, each have a substantially planar upper surface at or slightly below the adjoining silicon mesas. By producing planar field dielectric upper surfaces, various problems of non-planarity are removed from the thin films which are thereafter formed on the field dielectrics or between the field dielectrics and silicon mesas.

16 Claims, 3 Drawing Sheets

METHOD FOR FORMING SEMICONDUCTOR FIELD REGION DIELECTRICS HAVING GLOBALLY PLANARIZED UPPER SURFACES

BACKGROUND OF THE INVENTION

1. Field of the Invention

This invention relates to semiconductor fabrication and more particularly to an improved process of globally planarizing an isolation dielectric layer consistent with the upper surface of silicon mesas by selectively exposing upper elevation regions of the isolation dielectric to etchant-enhancing dopants.

2. Description of the Relevant Art

The fabrication of an integrated circuit involves placing numerous devices in a single semiconductor substrate. Select devices are interconnected by a conductor which extends over a dielectric which separates or "isolates" those devices. Implementing an electrical path across a monolithic integrated circuit thereby involves selectively connecting isolated devices. When fabricating integrated circuits it must therefore be possible to isolate devices built into the substrate from one another. From this perspective, isolation technology is one of the critical aspects of fabricating a functional integrated circuit.

A popular isolation technology used in isolating MOS integrated circuit devices includes a process known as local oxidation of silicon. Local oxidation of silicon, or LOCOS, involves oxidizing field regions between devices. The oxide grown in field regions are termed field oxide, wherein field oxide is grown during the initial stages of integrated circuit fabrication, before source and drain implants are placed in device areas or active areas. By growing a thick field oxide in isolation (or field) regions pre-implanted with a channel-stop dopant, LOCOS processing serves to prevent the establishment of parasitic channels in the field regions.

While LOCOS has remained a popular isolation technology, there are several problems inherent with LOCOS. Those problems are well documented, and include bird's-beak encroachment, channel-stop redistribution, topological disparity and localized field oxide thinning. These four problems, amongst others, places severe limitations on LOCOS as a viable technology in high density MOS processing.

In an effort to overcome the problems of LOCOS, a technique known as "shallow trench process" has been discovered. The shallow trench process is better suited for isolating densely spaced active devices having field regions less than, for example, 10.0 microns in lateral dimension. The shallow trench process involves the step of etching a silicon substrate surface to a relatively shallow depth, e.g., between 0.2 to 0.5 microns, and then refilling the shallow trench with a deposited dielectric, herein referred to as a fill dielectric, or simply "dielectric". After the trench is filled with the dielectric, it is then planarized to complete the isolation structure. Resulting from planarization, a silicon mesa is exposed between several field dielectrics formed from the planarized fill dielectric.

While the trench isolation process has many advantages over LOCOS, it cannot in all instances achieve complete global planarization across the entire semiconductor topography. The upper surface of the fill dielectric in large isolation areas is generally at a lower elevational level than the upper surface fill dielectric in small isolation areas. This is due in part to a propensity of the dielectric to readily fill small area trenches, but not sufficiently fill large area trenches.

Most manufacturers have focused on fairly complex processes for planarizing large and small area fill dielectrics. Conventional processes generally involve rework of the fill dielectric upper surface in an attempt to bring small and large dielectric upper surfaces to a equal elevational level commensurate with silicon mesas which reside between trenches. Silicon mesas are defined herein as the portions of the silicon substrate surface which are retained, and silicon mesas exist between the shallow trenches. The fill dielectric is deposited across both the shallow trenches and silicon mesas. However, during planarization, the fill dielectric is removed from the silicon mesas ideally leaving a dielectric upper surface which is at the same elevational level across the entire wafer—regardless of the lateral area of the dielectrics being planarized. Unfortunately, conventional planarization processes such as chemical-mechanical polish (CMP), and sacrificial etchback can not achieve the idealized result.

The fill dielectric will generally fill small area trenches to an elevational level above the upper surface of a large area fill dielectric. When CMP is applied, the polishing pad will inherently flex or conform under pressure to the underlying topography, causing the polishing pad to attack and remove the already low elevational height of dielectric in large area trenches. If dielectric in those trenches is not sufficiently thick to withstand the attack, the fill dielectric upper surface will be removed below the desired elevation of adjacent silicon mesa upper surfaces. Accordingly, CMP is not ideally effective when planarizing, for example, fill dielectrics in trenches greater than 10.0 $\mu$m (microns) in lateral size. The planarization problem associated with CMP also presents itself in the sacrificial etchback technique. Generally speaking, sacrificial materials including photoresist, polyimide or spin-on glass (SOG) typically deposit on top of large features (i.e., large area silicon mesas) the same as the thickness over adjacent large area trenches. For large area features, the resulting upper surface of the sacrificial layer is thereby substantially the same as the underlying large area regions. Thus, even if the sacrificial material is removed at the same etch rate as the underlying fill dielectric, the fill dielectric after etch will conform to the unevenness of the sacrificial layer upper surface.

The problems associated with CMP and sacrificial etchback are generally dependent upon the sizes of the underlying features. If the features are too large or spaced too far apart, then global planarization cannot be achieved. Absent global planarization commensurate with the upper surface of silicon mesas, problems such as poor step coverage and the occurrence of metal stringers at the sides of severe step areas may occur. Further, a non-planar surface will cause improper patterning of overlying films due to depth-of-field limitations of most optical-lithography tools. Generally speaking, conventional lithography tools require a planar surface within 0.5 microns in order to pattern a sub micron feature thereon.

It is, therefore, desirable to present a process in which the fill dielectric, regardless of the trench size, can be planarized to substantially the same elevational level entirely across the field region. The resulting field dielectric formed within a field region (or trench) thereby must include an upper surface which is consistent across the entire field region and substantially equal to the upper surface of the adjacent silicon mesa. Thus, a method must be derived which can planarize the fill dielectric to the same elevational level within each trench and across all trenches existing within a semiconductor topography. Accordingly, the derived process must be one which can planarize the entire wafer surface, i.e., globally planarize that surface without suffering the limitations of conventional CMP and sacrificial etchback.

SUMMARY OF THE INVENTION

The problems outlined above are in large part solved by the improved planarization process hereof. The improved process involves depositing a fill dielectric across both silicon mesas and trenches, and then planarizing the fill dielectric according to etch-enhancing ions placed within select regions of the fill dielectric. The etch-enhancing ions are selectively forwarded to upper elevational regions of the fill dielectric. Accordingly, a masking material is placed upon the lower elevational regions prior to ion implantation. The masking material, according to one embodiment, is photoresist patterned over large trenches (i.e., trenches exceeding a certain length or width). Preferably, the masking material is placed over trenches having a length or width exceeding 10.0 microns.

Once the masking material is in place, the etch-enhancing ions, such as phosphorus and/or boron are placed into the exposed regions of the fill dielectric. After the masking material is removed, the fill dielectric is subjected to an etchant which removes doped regions faster than undoped regions. More specifically, the upper, doped elevational areas of the fill dielectric are removed at a faster rate than large area, undoped, lower elevational regions. The etch process is continued for a time sufficient to remove a substantial portion of the fill dielectric, but is terminated prior to exposing the silicon mesas.

Upon completion of the etch step, the remaining fill dielectric still retains to some extent an uneven planarity which is thereafter removed either by a sacrificial etchback process or CMP. If sacrificial etchback is used, a sacrificial material is placed over the remaining fill dielectric, and then the sacrificial material and underlying fill dielectric are removed at substantially the same rate. Since the remaining fill dielectric is more planar than its initial surface, the sacrificial etchback material is also more planar than it would be if placed on the initial fill dielectric surface. Thus, in this instance, sacrificial etchback produces a more planar surface than conventional etchback on drastically uneven topographies. Sacrificial etchback is continued for a time duration necessary to expose all silicon mesas, leaving a substantially planar surface of fill dielectric in both large and small trench regions entirely across the semiconductor wafer. If CMP is used in lieu of sacrificial etchback, the polishing pad and chemical slurry are applied directly upon the remaining fill dielectric. Advantageously, CMP readily removes the thin film of dielectric remaining over silicon mesas at the same time in which elevational disparities over large and small trenches are also removed. CMP is useful at this stage since the remaining fill dielectric is made more planar than its initial state. Since it is more planar, the remaining fill dielectric does not cause significant flexure of the CMP pad as in conventional CMP processes placed on relatively uneven surfaces.

After the fill dielectric is planarized using selective etch-enhancing dopants followed by partial etchback, followed by complete etchback using either sacrificial or CMP techniques, the resulting structure includes field dielectrics placed between silicon mesas. As defined herein, silicon mesas are those areas in which active devices are formed. Field dielectrics are areas where active devices are not formed, and serve to electrically isolate the operation of devices The present process advantageously forms field dielectrics of varying lateral dimension and, more importantly, produces a planar upper surface of those variable sized field dielectrics even in instances where one side of a field dielectric exceeds 10.0 microns.

BRIEF DESCRIPTION OF THE DRAWINGS

Other objects and advantages of the invention will become apparent upon reading the following detailed description and upon reference to the accompanying drawings in which.

Figure 1:
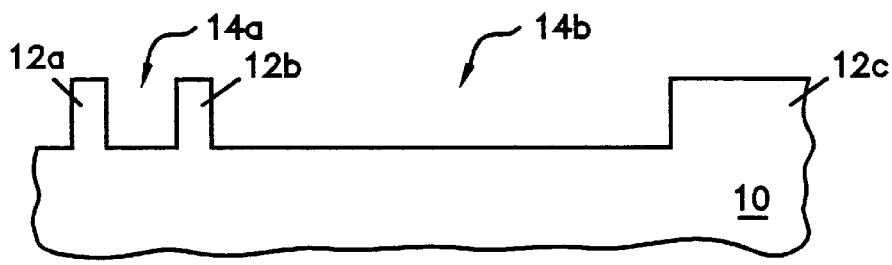
FIG. 1 is a partial cross-sectional view of a semiconductor topography with a series of large and small area silicon mesas spaced across the topography.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to drawings, FIG. 1 illustrates a partial cross-sectional view of a semiconductor topography 10. Topography 10 includes a series of large and small area silicon mesas 12a, 12b and 12c spaced from each other by trenches 14a and 14b. Trenches 14 are formed by selectively removing the upper surface of semiconductor topography 10 to an elevational level below the initial elevational level. Preferably, between 0.2 to 0.5 microns of the upper topography are removed to form trenches 14 and present mesas 12 therebetween.

Figure 2:
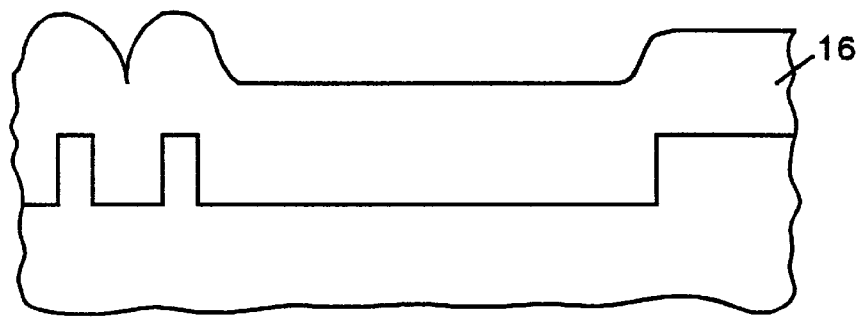
FIG. 2 illustrates a processing step subsequent to that of FIG. 1, wherein a fill dielectric (i.e., dielectric) is deposited across and between the silicon mesas.

FIG. 2 illustrates a processing step subsequent to FIG. 1, wherein a fill dielectric 16 is deposited across the entire topography 10, and particularly over and between silicon mesas 12. Dielectric 16 is preferably deposited from a silane or tetraethyl orthosilicate (TEOS) source within a chemical vapor deposition (CVD) reactor. Dielectric 16 is deposited from an undoped source material either as a high temperature CVD oxide film, or a lower temperature plasma enhanced CVD oxide film. Accordingly, dielectric 16 preferably comprises $SiO_2$ ("oxide") or a TEOS material. In some instances, it may be desirable to use an ozone source to enhance the flow capability of deposited dielectric 16. Dielectric 16, however, must be somewhat conformal, and the flow capability is not necessarily required since planarization of the upper surface is advantageously achieved by subsequent processing steps.

Figure 3:
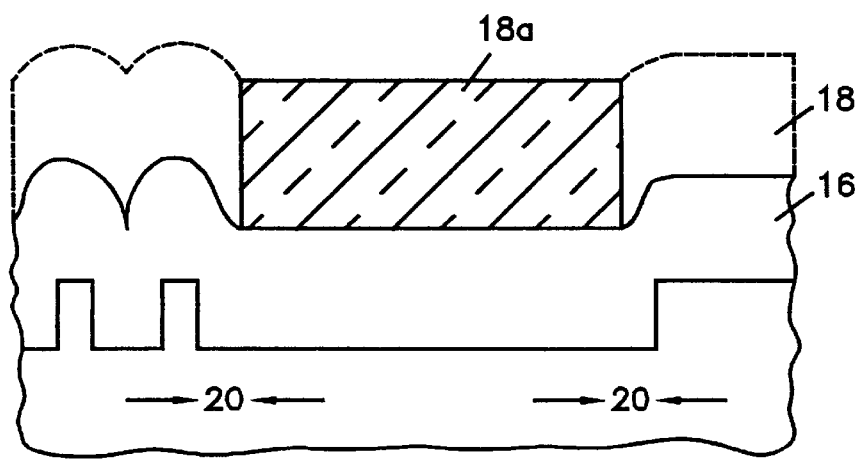
FIG. 3 illustrates a processing step subsequent to that of FIG. 2, wherein a masking material is patterned across lower elevational regions of the isolation dielectric.

FIG. 3 illustrates deposition of a masking material 18 upon fill dielectric 16. The masking material thereafter undergoes selective exposure and removal to produce a patterned masking material 18a. The patterned masking material 18a occurs only in lower elevational regions of dielectric 16. More specifically, a projection printing mask is used to produce patterned material 18a only in trench areas 14b. More specifically, material 18a is produced by a mask which identifies isolation regions greater than 10.0 microns per side. Thus, patterned material 18a exists in large isolation regions (or trenches) 14b and not in small isolation regions 14a. Generation of a suitable projection mask and duplication of that mask upon patterned material 18a is relatively straight forward since the projection mask can be derived from the same mask which produces large area trenches 14b. The mask used in producing a pattern within material 18 is sized downward in lateral dimension from the mask used in forming trench 14b, as shown by reference numeral 20. A simple shrink procedure of select regions from one mask to another mask is readily achievable given current mask and reticle production techniques.

Figure 4:
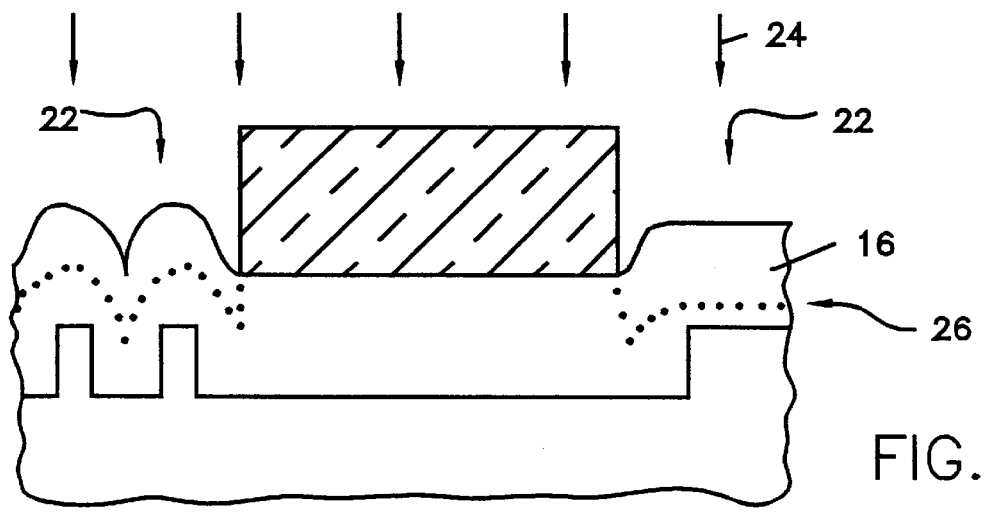
FIG. 4 illustrates a processing step subsequent to that of FIG. 3, wherein the patterned masking material serves to block passage of implant ions into the fill dielectric.

Turning now to FIG. 4, exposed regions 22 of dielectric 16 receive etch-enhancing ions shown by reference numeral 24. Ions 24 are implanted to a depth below the initial surface of dielectric 16. The implant depth (maximum range) is shown by reference numeral 26.

Similar to the effect of using phosphorus or boron within a silane-formed $SiO_2$ film, the phosphorus or boron atoms not only reduce stress in the oxide film, but also increase the etch rate of a plasma etchant applied to the oxide. Thus, if dielectric 16 is an oxide or TEOS, then any phosphorus or boron ions 24 placed within dielectric 16 will make those doped regions more susceptible to a plasma etchant containing fluorine and carbon. Fluorocarbon-containing plasmas prove suitable in interacting with Si or $SiO_2$ surface atoms. Addition of hydrogen or oxygen changes the etch rate of Si or $SiO_2$-bearing dielectric 16. Regardless of the fluorine-to-carbon ratio or the hydrogen-to-oxygen ratio, implanted ions 24 leave a dielectric which etches at a faster rate than regions which are not doped.

Addition of ions 24 also serve to enhance the polish rate of regions receiving the ions. For example, Si or $SiO_2$-bearing dielectric 16 having phosphorous or boron dopants is more susceptible to a chemical-mechanical polish (CMP) than dielectric 16 not having such dopants.

Figure 5:
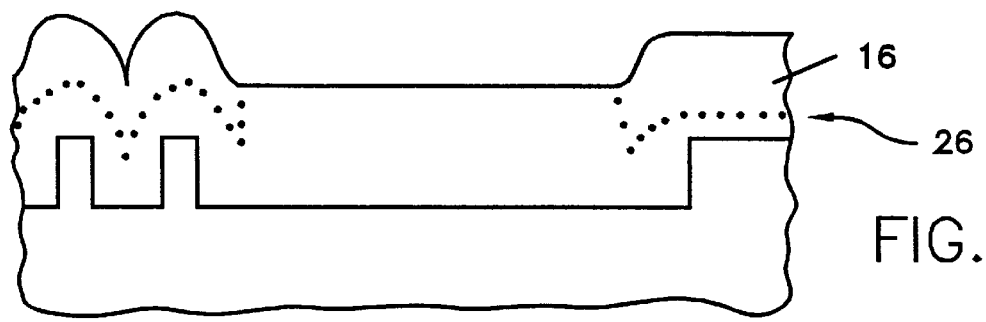
FIG. 5 illustrates a processing step subsequent to that of FIG. 4, wherein the patterned masking layer is removed.

FIG. 5 illustrates a processing step subsequent to FIG. 4, wherein patterned material 18a is removed. Material 18 is preferably a photoresist material, a suitable photoresist being one which is sensitive to ultraviolet light and has sufficient density so as to block passage of ions 24.

Figure 6:
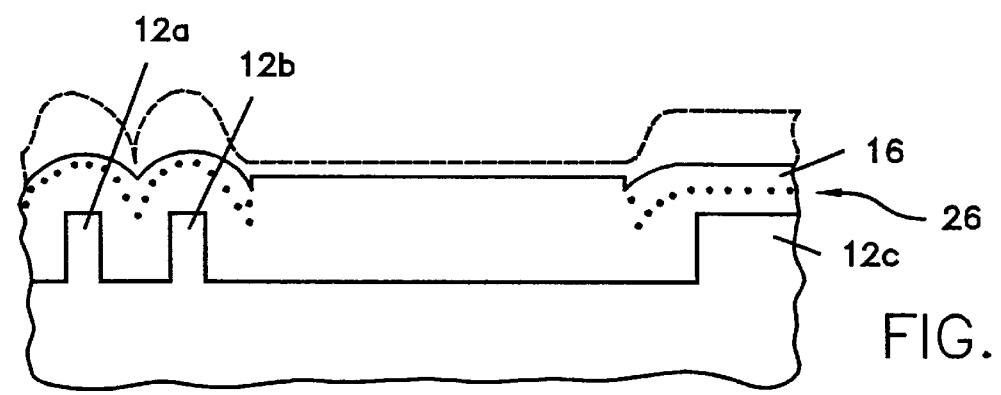
FIG. 6 illustrates a processing step subsequent to that of FIG. 5, wherein the upper surface of the fill dielectric is removed.

FIG. 6 illustrates an etchant applied across the entire surface of fill dielectric 16. The etchant, preferably a plasma etch material described above, removes the upper surface of fill dielectric 16 predominantly in regions which have etch-enhancing atoms therein. The etch process is continued for a time sufficient to remove large portions of the higher elevational regions but is discontinued prior to exposing the upper surfaces of silicon mesas 12. Preferably, implant depth 26 is tailored such that it exists below the remaining surface of fill dielectric 16, as shown in FIG. 6. Thus, atoms resulting from ion implant occur throughout the areas which receive rapid etching.

Figure 7:
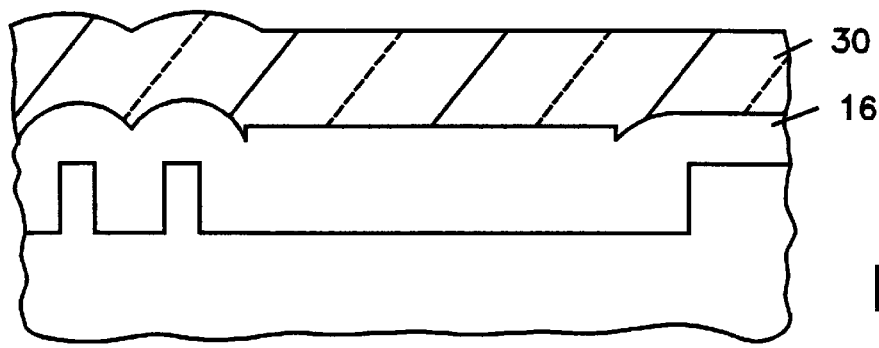
FIG. 7 illustrates a processing step subsequent to that of FIG. 6, wherein a sacrificial layer is deposited upon the remaining isolation dielectric.

Turning now to FIG. 7, a first step in the removal of the remaining fill dielectric 16 is shown, according to one embodiment. More specifically, FIG. 7 depicts a first step in a sacrificial etchback process, wherein a sacrificial layer 30 is deposited upon the remaining dielectric 16. Sacrificial layer 30 is made of any material which can to some extent conform, but more importantly planarize the upper surface of dielectric 16. Layer 30 upper surface is smoother than the upper surface of dielectric 16. Layer 30 can be made of any material having the above characteristics, suitable material include photoresist, SOG, polyimides, or $SiO_2$. Composition of material 30 is chosen such that it etches at the same rate as underlying dielectric 16. Thus, FIG. 8 illustrates a processing step subsequent to FIG. 7, wherein the upper surface of material 30 is to some extent translated to the field dielectrics 32a, 32b and 32c.

Figure 8:
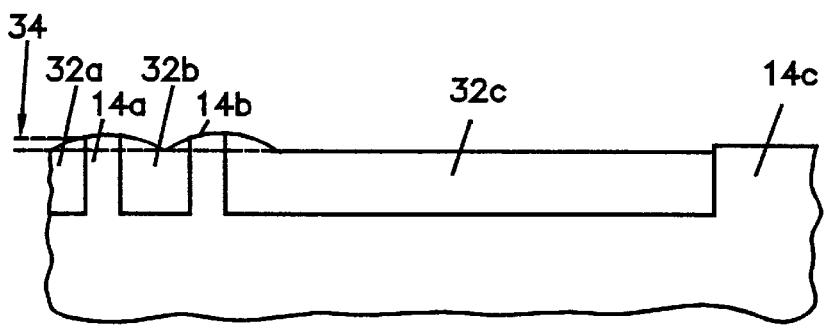
FIG. 8 illustrates a processing step subsequent to that of FIG. 7, wherein the sacrificial layer and the upper surface of the remaining isolation dielectric are removed to expose the silicon mesa upper surfaces.

Field dielectrics 32 are shown in FIG. 8 having an upper surface substantially equal to the upper surface of silicon mesas 14. According to the embodiment shown in FIG. 8, field dielectric 32 upper surfaces are slightly below silicon mesa 14 upper surfaces. However, regardless of the relative differences in upper surfaces between fill dielectric 32 and silicon mesas 14, all fill dielectric upper surfaces are at substantially the same level, regardless of the lateral area of the fill dielectrics. Substantial similarity in elevational levels is depicted by the dashed line shown as reference numeral 34.

Figure 9:
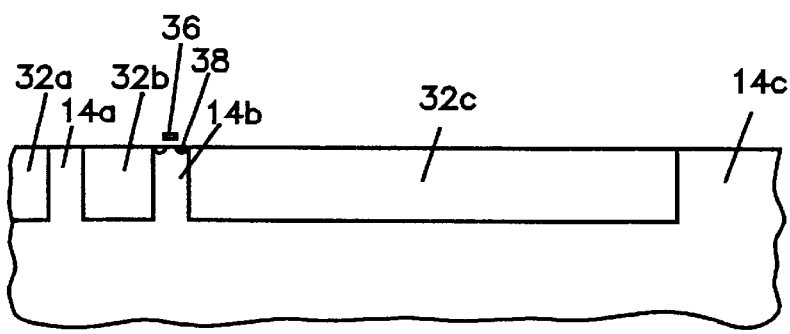
FIG. 9 illustrates according to an alternative embodiment a processing step subsequent to that of FIG. 6, wherein the upper surface of the remaining isolation dielectric is removed to expose the silicon mesa upper surface.

FIG. 9 illustrates, according to an alternative embodiment, a process step used in planarizing dielectric 16 upper surface formed according to the step shown in FIG. 6. More specifically, FIG. 9 illustrates removal of remaining dielectric 16 over silicon mesas 14 using a CMP technique. CMP proves beneficial in removing high spots of dielectric 16 upper surface commensurate with low spots, and substantially equal to the upper surface of silicon mesas 14. Since the height of dielectric 16 above silicon mesas is substantially the same as the height of dielectric 16 in large and small trenches, CMP can be employed without the problems associated with CMP applied over vastly different elevational heights. Accordingly, the pre-planarization steps of FIGS. 4–6 serve to prepare the final CMP step for optimal removal, as shown in FIG. 9. FIG. 9 also depicts subsequent processing steps wherein silicon mesa 14b, as well as other silicon mesas, are configured to receive a gate conductor 36 and, according to a self-aligned process, source and drain implants 38. It is noted that silicon mesas 14 are those which receive gate conductors and source/drain implants as would be necessary to form active devices. Field dielectrics 32, on the other hand, serve merely to isolate devices formed in separate silicon mesas 14. No active devices are thereby formed within field dielectrics 32.

It would be appreciated by those skilled in the art having the benefit of this disclosure that this invention is capable of applications with numerous types of MOS-processed circuits. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A method for planarizing a field dielectric between a pair of silicon mesas, comprising:

providing a spaced pair of active regions within a silicon substrate;

removing a portion of the silicon substrate between the pair of active regions to form a pair of silicon mesas separated by a trench;

depositing a dielectric within the trench and across the pair of silicon mesas;

depositing a photoresist material upon the dielectric and selectively removing a portion of the photoresist material from the dielectric in regions above said pair of silicon mesas;

implanting etch enhancing ions into said dielectric in regions above said pair of silicon mesas removed of said photoresist material removing the remaining said photoresist material;

etching away an upper portion of said dielectric to an elevation level above the upper surface of said silicon mesas; and removing the remainder of said dielectric residing above said silicon mesas to form a field dielectric between the silicon mesas having an upper surface substantially equal in elevation to the upper surface of said silicon mesas.

2. The method as recited in claim 1, wherein said active regions comprise areas into which a dopant of source and drain impurity are introduced.

3. The method as recited in claim 1, wherein said active regions comprise areas over which a gate conductor is formed.

4. The method as recited in claim 1, wherein said removing a portion of the silicon substrate comprises etching away between 0.2 to 0.5 micron of an upper surface of said silicon substrate.

5. The method as recited in claim 1, wherein said depositing the dielectric comprises chemical vapor depositing an oxide from a silane source or a TEOS source.

6. The method as recited in claim 1, wherein said etch enhancing ions comprise phosphorous or boron ions.

7. The method as recited in claim 1, wherein said removing of the remainder of the dielectric comprises:

depositing a sacrificial layer upon the etched dielectric surface; wherein said sacrificial layer comprises a material that etches at the same rate as said etched dielectric; and removing said sacrificial layer and said remainder of said dielectric residing above said silicon mesas.

8. The method as recited in claim 1, wherein said removing a remainder of said dielectric comprises chemical mechanical polishing away said remainder of said dielectric.

9. The method as recited in claim 1, wherein said field dielectric comprises a length measurement between said silicon mesas of greater than 10.0 microns.

10. A method for planarizing an upper surface of a dielectric substantially equal to an upper surface of a silicon mesa, comprising:

providing a silicon substrate having a substrate upper surface which comprises a pair of trenches formed on opposite sides of a silicon mesa;

depositing a dielectric upon the substrate upper surface;

depositing a photoresist material upon the dielectric and selectively removing a portion of the photoresist material from the dielectric in regions above said silicon mesa;

implanting etch enhancing ions into said dielectric in regions removed if said photoresist material above said silicon mesa to a depth below an upper surface of said dielectric in regions above said trenches;

removing the remaining said photoresist material;

etching away an upper surface of said dielectric to an elevation level above the upper surface of said silicon mesa; and removing the remainder of said dielectric to an elevation level approximately equal to an upper surface of said silicon mesa.

11. The method as recited in claim 10, wherein said removing the remainder of said dielectric comprises:

depositing a sacrificial layer upon the etched dielectric surface; wherein said sacrificial layer comprises a material that etches at the same rate as said etched dielectric; and removing said sacrificial layer and the remainder of said dielectric in regions above said silicon mesa.

12. The method as recited in claim 10, wherein said removing the remainder of said dielectric comprises:

polish removing the remainder of said dielectric from said silicon mesa.

13. A method for planarizing an upper surface of a field dielectric substantially equal to an upper surface of a silicon mesa, comprising:

removing a portion of a silicon substrate upper surface to produce a trench and a pair of silicon mesas spaced greater than 10.0 microns apart extending from the trench;

depositing a dielectric within the trench and upon the silicon mesas;

patterning a photoresist material upon an upper surface of said dielectric in regions exclusively above said trench;

implanting etch enhancing ions into said dielectric between patterned said photoresist material, wherein said etch enhancing ions are implanted into said dielectric to a depth below said upper surface of said dielectric in regions above said trench; and removing said photoresist material;

etching away an upper surface of said dielectric to an elevation level above the upper surface of said silicon mesa, wherein a remainder of said dielectric resides above said silicon mesa; and removing the remainder of said dielectric to an elevation level approximately equal to an upper surface of said silicon mesa to form a field dielectric having an upper surface approximately equal to the upper surface of said silicon mesa and also having a lateral boundary defined by said silicon mesas.

14. The method as recited in claim 13, wherein said etch enhancing ions comprise phosphorous and boron ions.

15. The method as recited in claim 13, wherein removing the remainder of said dielectric comprises:

depositing a sacrificial layer upon the etched dielectric surface; wherein said sacrificial layer comprises a material that etches at the same rate as said etched dielectric; and removing the sacrificial layer and a remainder of said dielectric.

16. The method as recited in claim 13, wherein removing the remainder of said dielectric comprises:

polish removing the remainder of said dielectric from said silicon mesas.

* * * * *

UNITED STATES PATENT AND TRADEMARK OFFICE
CERTIFICATE OF CORRECTION

PATENT NO. : 5,830,773

DATED : November 3, 1998

INVENTOR(S) : William S. Brennan et al.

It is certified that error appears in the above-identified patent and that said Letters Patent is hereby corrected as shown below:

In the Claims:

Claim 10, col. 8, line 2, before "said photoresist material", please delete "if" and substitute therefor --of--.

Signed and Sealed this

Second Day of March, 1999

Attest:

Q. TODD DICKINSON

Attesting Officer

Acting Commissioner of Patents and Trademarks